US008558330B2

(12) United States Patent
Yu et al.

(10) Patent No.: US 8,558,330 B2
(45) Date of Patent: Oct. 15, 2013

(54) DEEP WELL PROCESS FOR MEMS PRESSURE SENSOR

(75) Inventors: Shao-Chi Yu, Hsinchu (TW); Hong-Seng Shue, Hsinchu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/541,918

(22) Filed: Jul. 5, 2012

(65) Prior Publication Data

US 2013/0105923 A1     May 2, 2013

Related U.S. Application Data

(60) Provisional application No. 61/553,475, filed on Oct. 31, 2011.

(51) Int. Cl.
    *G01L 9/00*      (2006.01)
(52) U.S. Cl.
     USPC ............ 257/419; 257/E21.219; 257/E29.324; 257/E21.216; 257/E21.559; 257/E21.599; 438/53; 438/462; 438/62; 438/977
(58) Field of Classification Search
     USPC ........... 257/419, E21.219, E29.324, E21.216, 257/E21.559, E21.599; 438/53, 462, 622, 438/977
See application file for complete search history.

(56) References Cited

U.S. PATENT DOCUMENTS

| | | | | |
|---|---|---|---|---|
| 3,893,228 A * | 7/1975 | George et al. | ................ | 438/53 |
| 4,033,787 A * | 7/1977 | Marshall | .................... | 438/53 |
| 4,054,497 A * | 10/1977 | Marshall | .................... | 205/656 |
| 4,618,397 A * | 10/1986 | Shimizu et al. | ................ | 438/53 |
| 5,002,901 A * | 3/1991 | Kurtz et al. | .................... | 438/51 |
| 5,283,459 A * | 2/1994 | Hirano et al. | ................ | 257/419 |
| 5,320,705 A * | 6/1994 | Fujii et al. | .................... | 438/51 |
| 5,511,428 A * | 4/1996 | Goldberg et al. | ............... | 73/777 |
| 5,514,898 A * | 5/1996 | Hartauer | ...................... | 257/417 |
| 5,643,803 A * | 7/1997 | Fukada et al. | ................ | 438/50 |
| 5,869,876 A * | 2/1999 | Ishio et al. | .................... | 257/419 |
| 6,020,618 A * | 2/2000 | Sakai | ............. | 257/419 |
| 6,131,466 A * | 10/2000 | Vigna et al. | .................... | 73/721 |
| 6,218,717 B1 * | 4/2001 | Toyoda et al. | ............... | 257/419 |
| 6,218,866 B1 * | 4/2001 | Poplevine et al. | ............ | 326/103 |
| 6,293,149 B1 * | 9/2001 | Yoshida et al. | ............ | 73/514.01 |
| 6,472,244 B1 * | 10/2002 | Ferrari et al. | ................... | 438/53 |
| 6,747,329 B2 * | 6/2004 | Yoshihara et al. | ............ | 257/419 |
| 6,765,300 B1 * | 7/2004 | Wagenaar et al. | ............ | 257/780 |
| 6,826,320 B2 * | 11/2004 | Deliwala | ......................... | 385/14 |
| 6,875,673 B2 * | 4/2005 | Ishio | ......................... | 438/462 |
| 7,091,057 B2 * | 8/2006 | Gan et al. | ....................... | 438/48 |
| 7,192,819 B1 * | 3/2007 | Padmanabhan et al. | ...... | 438/197 |
| 7,514,285 B2 * | 4/2009 | Brown et al. | .................. | 438/50 |
| 7,514,287 B2 * | 4/2009 | Huang et al. | ................... | 438/53 |

(Continued)

*Primary Examiner* — N Drew Richards
*Assistant Examiner* — Ankush Singal
(74) *Attorney, Agent, or Firm* — Eschweiler & Associates, LLC

(57) ABSTRACT

A micromechanical systems (MEMs) pressure sensor includes a semiconductor substrate having a deep well located within a first surface and a cavity located within a second, opposing surface. The semiconductor substrate has a first doping type. The deep well has a second doping type, with a gradient doping profile, thereby forming a PN junction within the substrate. The cavity forms a diaphragm, which is a substrate section that is thinner than the surrounding substrate sections, that comprises the deep well. One or more pizeoresistor elements are located within the deep well. The piezoresistors are sensitive to deformations, such as bending, in the diaphragm caused by changes in the pressure of the cavity.

20 Claims, 7 Drawing Sheets

(56) References Cited

U.S. PATENT DOCUMENTS

| | | | |
|---|---|---|---|
| 7,527,997 B2* | 5/2009 | Xu et al. | 438/52 |
| 8,330,224 B2* | 12/2012 | Kwa | 257/351 |
| 2004/0253760 A1* | 12/2004 | Zhang et al. | 438/53 |
| 2006/0141659 A1* | 6/2006 | Gan et al. | 438/51 |
| 2007/0164379 A1* | 7/2007 | Brown et al. | 257/417 |
| 2008/0061374 A1* | 3/2008 | Chiang et al. | 257/371 |
| 2008/0278279 A1* | 11/2008 | Chiang et al. | 338/311 |
| 2010/0304518 A1* | 12/2010 | Suminto et al. | 438/51 |
| 2012/0012949 A1* | 1/2012 | Winkler et al. | 257/415 |
| 2012/0081171 A1* | 4/2012 | Tan et al. | 327/427 |

* cited by examiner

DEEP WELL PROCESS FOR MEMS PRESSURE SENSOR

BACKGROUND

Piezoresistive micromechanical system (MEM) pressure sensors are configured to translate a pressure into an electrical signal corresponding to the pressure. Normally, a piezoresistive MEMs pressure sensor comprises a pliable diaphragm having one or more resistive elements diffused into it. The diaphragm is configured to measure a pressure within an adjacent cavity based upon resistive changes caused by a force that the pressure exerts on the diaphragm. For example, a high pressure within an adjacent cavity causes the diaphragm to bend in a first direction that compresses the resistive element, thereby decreasing the resistance. Alternatively, a low pressure in the cavity causes the diaphragm to bend in a second direction that expands the resistive elements, thereby increasing the resistance.

The diaphragm is formed within a silicon substrate using an electrochemically controlled etching (ECE) process. The ECE process utilizes a wafer comprising a p-type substrate with an n-type epitaxial layer formed thereupon. During etching, the wafer is immersed in an etchant (e.g., a KOH bath), and a controlled bias is applied between the n-type epitaxial layer and the etchant. A PN junction, formed at the border of the n-type epitaxial layer and the p-type substrate, acts as a reverse-biased diode preventing the etchant from being exposed to any current, so that the etchant performs a normal anisotropic etch through the substrate until it reaches the junction. Then, because the diode has been etched away, the etchant is exposed to the applied bias, and a reaction forms a thin layer of silicon dioxide on the substrate, which stops the etch.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to the more detailed description that is presented later.

In an embodiment, the present disclosure relates to a method of MEMs processing. The method comprises providing a semiconductor substrate having a first doping type. A deep well having a second doping type is formed within the semiconductor substrate. One or more shallow wells having the first doping type are formed within the deep well, wherein the one or more shallow wells operate as resistive elements within the deep well. A backside of the semiconductor substrate is selectively etched by performing an electrochemically controlled etching (ECE) process to form a cavity abutting the deep well, resulting in a diaphragm structure that operates as a piezoresistor configured to measure pressure within the cavity.

In another embodiment, the present disclosure relates to a MEMs pressure sensor. The MEMs pressure sensor comprises a substrate having a first doping type. A deep well located within a top side of the substrate, wherein the deep well comprises a second doping type having a gradient doping profile. A cavity is disposed within a backside of the substrate at a position opposing the deep well, such that the deep well abuts the cavity. The cavity forms a pliable diaphragm within the substrate having a thickness that is defined by the depth of the deep well.

In yet another embodiment, the present disclosure relates to a MEMs pressure sensor. The MEMs pressure sensor comprises a p-type non-epitaxial silicon substrate. A diaphragm is located within a top side of the non-epitaxial silicon substrate. An n-type deep well having a gradient doping profile is located within the diaphragm. One or more p-type shallow wells that operate as piezoelectric resistors are located within the n-type deep well. A cavity is located within the backside of the non-epitaxial silicon substrate and abuts the diaphragm. A pressure within the cavity is configured to generate a force that acts upon the diaphragm to change the piezoelectric resistors' resistance as a function of pressure within the cavity.

The following description and annexed drawings set forth in detail certain illustrative aspects and implementations of the disclosure. These are indicative of but a few of the various ways in which the principles of the disclosure may be employed.

DETAILED DESCRIPTION

Figure 1:
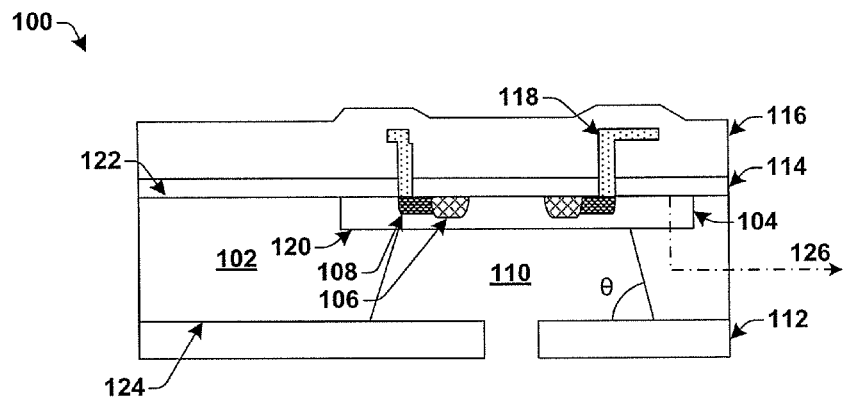
FIG. 1 illustrates a cross sectional view of an embodiment of a MEMs pressure sensor having a piezoresistive element comprising a deep well.

The description herein is made with reference to the drawings, wherein like reference numerals are generally utilized, to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Some aspects of the present disclosure provide for a micromechanical system (MEMs) pressure sensor comprising a semiconductor substrate having a first doping type (e.g., p-type). The substrate further comprises a deep well having a second doping type (e.g., n-type) with a gradient doping profile. The deep well is located within a diaphragm (i.e., a substrate section that is thinner than the surrounding substrate), which abuts a cavity located within the backside of the substrate. One or more piezoresistors are located within the deep well. The piezoresistors are sensitive to deformations (e.g., bending) in the diaphragm caused by changes in the pressure of the cavity. The resulting MEMs pressure sensor provides for cheaper sensor production than equivalent sensors utilizing an epitaxial layer.

FIG. 1 illustrates a cross sectional view of an embodiment of a micromechanical systems (MEMs) pressure sensor 100, which has a piezoresistive element comprising a deep well 104 formed within a substrate 102.

The substrate 102 has a first doping type and the deep well 104 has a second doping type. In some embodiments, the first doping type comprises a p-type dopant and the second doping type comprises an n-type dopant, such that the MEMs pressure sensor 100 comprises a p-type substrate having an n-type deep well. The deep well 104 is located within a top surface 122 (i.e., a frontside) of the substrate 102 and has a gradient doping profile that extends along doping cross section 126, which is perpendicular to the top surface 122 of the substrate 102. The doping profile along doping cross section 126 is illustrated in more detail below in FIG. 3. The deep well 104 has a bottom surface that is in contact with a cavity 110 located within a backside 124 of the substrate 102, such that the deep well 104 extends from a top surface 122 of the substrate to the cavity 110.

The cavity 110 comprises a steep sidewall angle θ formed by an electrochemically controlled etching (ECE) process that stops at a PN junction 120 located between the substrate 102 and the deep well 104. In some embodiments, the sidewall angle θ has an angle of 54.7° with the backside 124 of the substrate 102. The cavity 110 results in a pliable diaphragm comprising a bendable substrate section that is thinner than the surrounding substrate section. The pliable diaphragm is described in more detail with reference to FIG. 2 below. In FIG. 1, the pliable diaphragm comprises the deep well 104. In an embodiment, the cavity 110 may be partially enclosed by a glass or silicon layer 112 located along the backside 124 of the substrate 102. The diaphragm is configured to react to mechanical stress that is caused due to a pressure within the cavity 110.

In an embodiment, the diaphragm comprises one or more pressure sensing elements comprised within the deep well 104 and configured to measure a pressure within the cavity 110. In some embodiments, the pressure sensing elements comprise one or more piezoresistors formed within the deep well 104. In some embodiments, the one or more piezoresistors comprise diffusion piezoresistors comprising one or more shallow wells 106 located within the deep well 104. The one or more piezoresistors are configured to change resistivity based upon mechanical stress applied to the diaphragm. For example, a deformation in the crystal lattice of the diaphragm causes a change in the band structure of the piezoresistors in the diaphragm, leading to a change in the resistivity of the one or more piezoresistors.

In some embodiments, the one or more shallow wells 106 have a first doping type having a higher doping concentration than that of the deep well 104. In various embodiments, such diffusion piezoresistors comprise diffused n-wells or p-wells located within a deep p-well or a deep n-well, respectively. For example, in some embodiments, the one or more piezoresistors comprise a silicon n-well piezoresistor having a first and second shallow p-well formed within a deep n-well.

The one or more shallow wells 106 are connected by way of well contacts 108 to one or more metallization layers 118. In some embodiments, the metallization layers 118 are formed within an interlevel dielectric (ILD) layer 114 up until the far back end metallization layers, which will extend outward from the ILD layer 114 to a packaging comprising a passivation layer 116. In some embodiments, well contacts 108 have a first doping type with a higher doping concentration than that of the one or more shallow wells 106. The metallization layers 118 connect the piezoresistors to one or more integrated chip logic elements (not shown) configured to receive and translate an electrical signal corresponding to the resistive value of the diaphragm.

Figure 2:
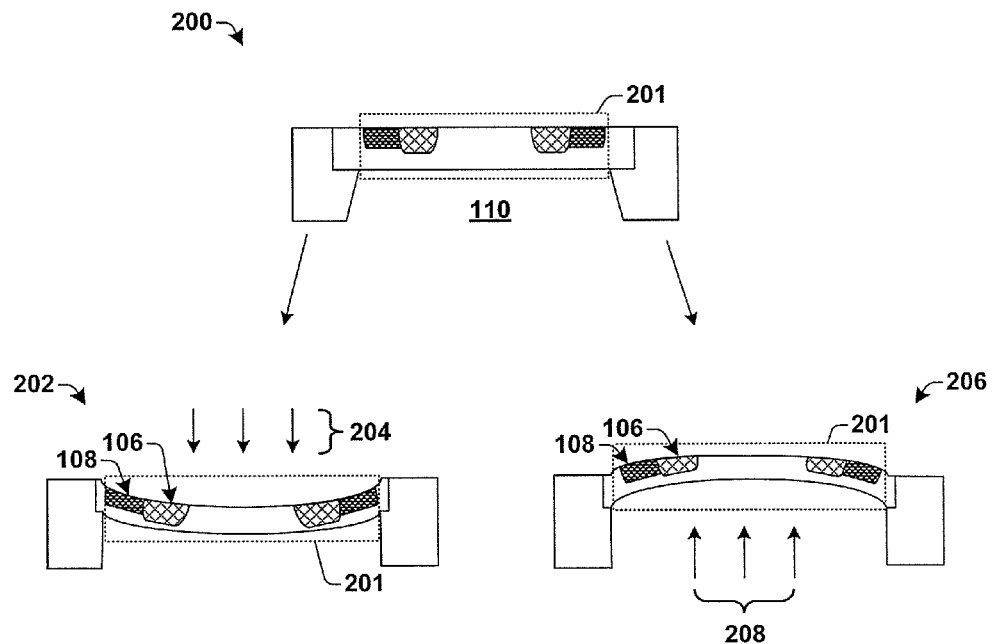
FIG. 2 illustrates an exemplary embodiment of a diaphragm of a MEMs pressure sensor in various stages of operation.

FIG. 2 illustrates an exemplary embodiment of a MEMs pressure sensor having a diaphragm 201 in various stages of operation. The MEMs pressure sensor is configured to measure a pressure within the cavity 110 based upon resistive changes caused by a force that the pressure within the cavity 110 exerts on the diaphragm 201. Side view 200 illustrates a MEMs pressure sensor in which the pressure within the cavity 110 is equal to the pressure on an opposite side of the diaphragm 201. As illustrated in side view 202, if the pressure within the cavity 110 is lower than the pressure on the opposite side of the diagram 201, the pressure difference causes a force 204 to push down on the diaphragm 201. This force 204 acts as a compressive force on the shallow wells 106, thereby decreasing the resistance of the shallow wells 106. Alternatively, as illustrated in side view 206, if the pressure within the cavity 110 is greater than the pressure on the opposite side of the diaphragm 201, the pressure difference causes a force 208 to push up on the diaphragm 201. This force 208 acts as a tensile force on the shallow wells 106, thereby increasing the resistance of the shallow wells 106.

Figure 3:
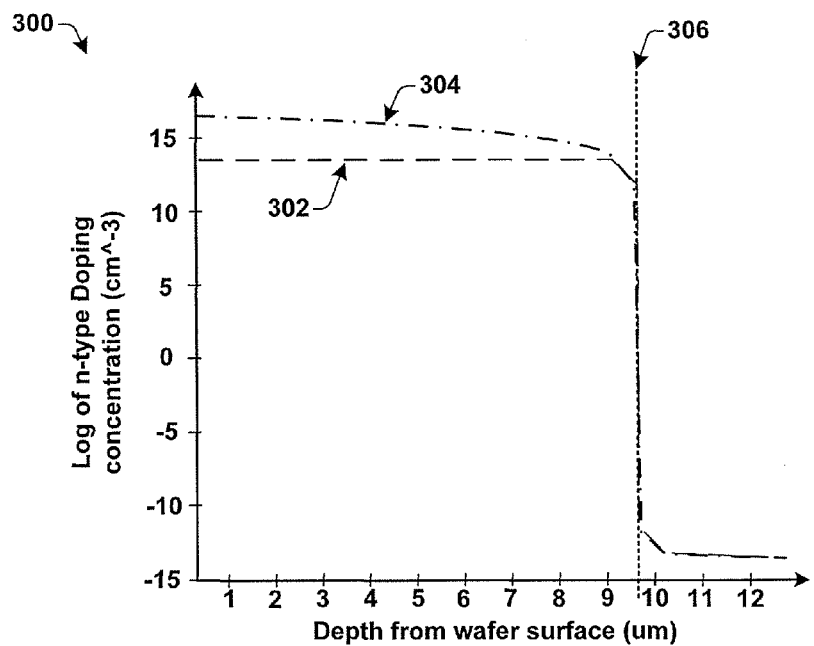
FIG. 3 illustrates a graph showing a simulation of the doping profile of a MEMs pressure sensor deep n-well, in accordance with an embodiment.

FIG. 3 illustrates a graph 300 showing a simulation of the doping profile of a MEMs pressure sensor having an n-type deep well corresponding to deep well 104 in FIG. 1, in accordance with an embodiment. It will be appreciated that since the n-type deep well (deep n-well) is formed by an implantation process, the resulting doping profile 304 of the deep n-well contains a gradient doping profile. The gradient doping profile extends perpendicular from the top surface of the substrate through the deep n-well, as illustrated by doping cross section 126 in FIG. 1. Graph 300 of FIG. 3 illustrates a logarithmic doping profile measured in $cm^{-3}$ along the y-axis. The depth from the wafer surface measured in μm is shown on the x-axis extending from the surface of the substrate 102 at 0 μm.

As illustrated in the graph 300, the doping profile 302 of an n-type epitaxial layer, which is typically used in another approach of MEMs pressure sensing devices, is constant over the depth of the epitaxial layer. In contrast, the doping profile 304 of a deep n-well comprises a gradient profile that extends from the surface of the substrate through the deep well to a PN junction 306 located at the intersection of the substrate 102 and deep well, 104, which is approximately 9.6 μm on the x-axis. The gradient profile comprises a dopant concentration that is inversely proportional to the distance from the substrate surface. For example, the doping profile 304 of a deep n-well decreases from approximately $10^{16}$ at the surface of the wafer to approximately $10^{11}$ at the PN junction 306.

The depth of the PN junction 306 can be varied to achieve a desired diaphragm thickness depending on the processing parameters of the implantation, including, for example, the implant dose and/or energy, a subsequent drive in time and/or temperature, etc. In an embodiment, the depth of the PN junction 306 and doping profile is determined prior to processing through use of predictive simulations, such as shown in FIG. 3. Such simulations provide for processing parameters that enable a precise PN junction depth and doping profile to optimize performance of the MEMs pressure sensor.

In graph 300, the PN junction 306 is located at a depth of approximately 9.7 um from the wafer surface. At depths greater than that of the PN junction 306, such as greater than 9.7 um, the doping profile changes from an n-type dopant to a p-type dopant, which is the dopant type of the substrate.

In an embodiment, the disclosed MEMs pressure sensor comprises a monolithic MEMS pressure sensor having a MEMs pressure sensing device comprised within a same integrated chip (e.g., within the same silicon die) as one or more CMOS devices. The integration of the MEMs pressure sensing device along with the one or more CMOS devices within a same integrated chip enables a relatively small die size and also allows the resistive signal to be processed in close proximity to the MEMs pressure sensor.

Figure 4:
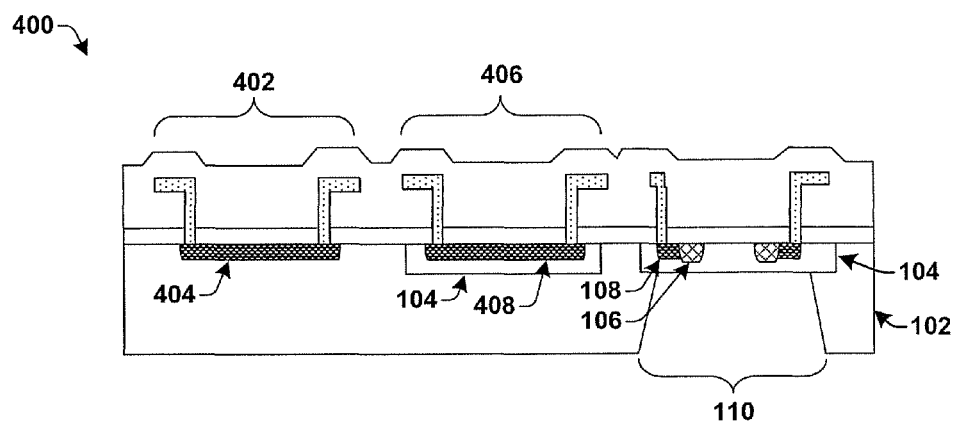
FIG. 4 illustrates a cross sectional view of an embodiment of a monolithic MEMs pressure sensor.

FIG. 4 illustrates a cross sectional view of an embodiment of a monolithic MEMs pressure sensor 400. In some other approaches, in which MEMs pressure sensing devices comprise an epitaxial layer having a first doping type (e.g., n-type), a CMOS component can only be fabricated in an environment having the first doping type, unless an extra well implantation process is added. However, the use of deep well(s) to form a MEMs pressure sensor diaphragm in accordance with various embodiments of the disclosure allows for CMOS components to be selectively fabricated within either an environment having a first doping type a (e.g., n-type material) or within an environment having a second doping type (e.g., a p-type material). This enables CMOS bulk isolation within the monolithic MEMs sensor for both p-type and/or n-type metal oxide semiconductor field effect transistors (MOSFETs).

For example, in an embodiment, a first region 402 of substrate 102 comprises a p-type material in which CMOS components 404 are located and a second, adjacent region 406 of the substrate comprises a n-type material in which CMOS components 408 are located. In an embodiment, the CMOS components 404 within the first region 402 comprise one or more PMOS transistors having n-type shallow wells within the p-type semiconductor substrate 102. In an embodiment, the CMOS components 408 within the second region 406 comprise one or more NMOS transistors having p-type shallow wells within the deep n-well 104. Therefore, the use of deep wells 104 within the substrate 102 allows bulk isolation for both NMOS and PMOS devices within a same substrate 102.

Figure 5:
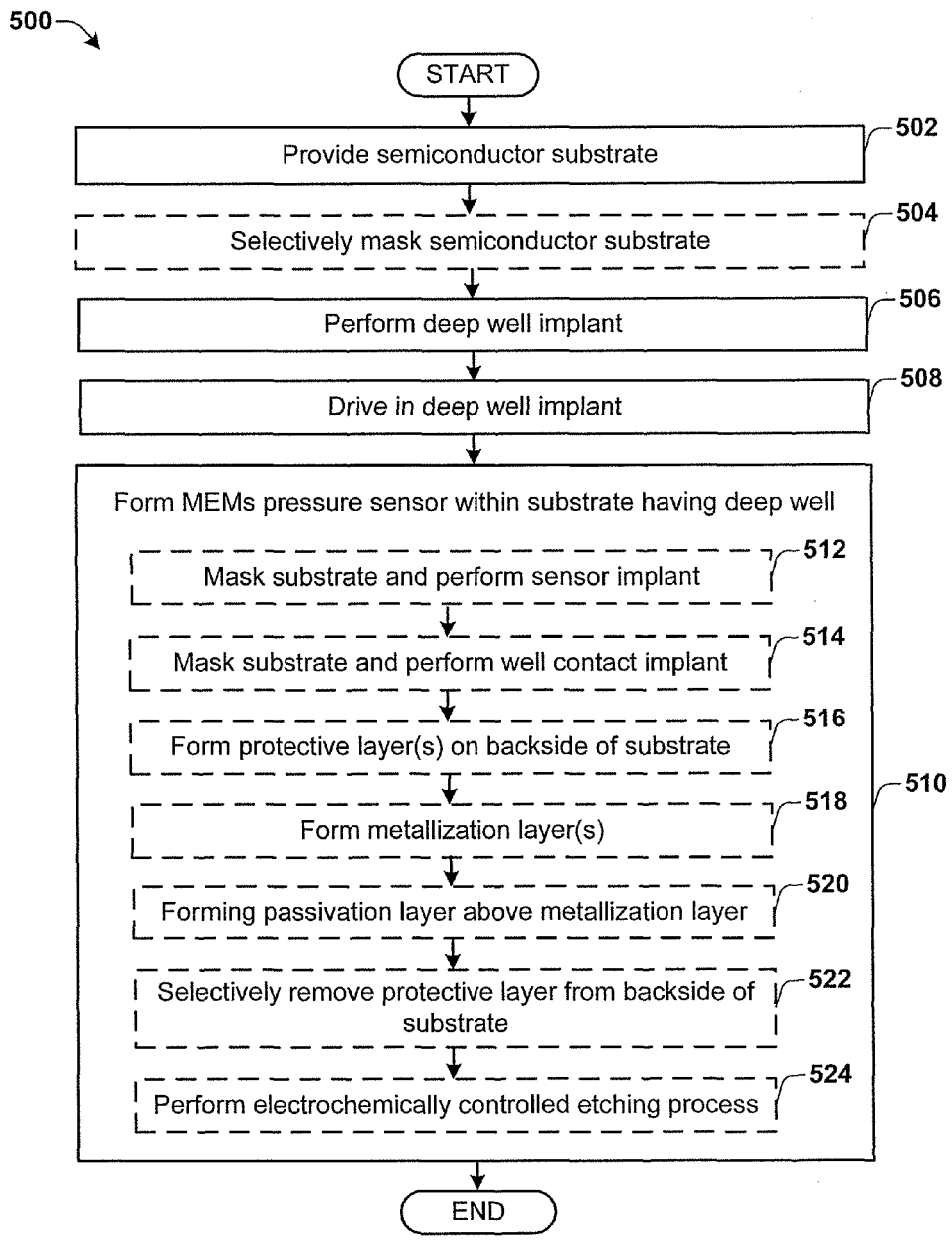
FIG. 5 is a flow diagram of an exemplary embodiment of a method for forming a MEMs pressure sensor.

FIG. 5 illustrates a flow diagram of an embodiment of an exemplary method 500 for forming a MEMs pressure sensor device. While method 500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 502, a semiconductor substrate is provided. In an embodiment, the semiconductor substrate comprises a silicon starting material, such as a single-crystal silicon with a <100> orientation, which has an n-type or p-type dopant concentration. In another embodiment, the semiconductor substrate comprises a non-epitaxial, double side polished p-type silicon substrate, not having an epitaxial layer grown on the surface of the substrate.

In an embodiment, the semiconductor substrate is selectively masked, at step 504. In some embodiments, step 504 is not performed, and is therefore illustratively shown in a dashed box. Selective masking of the semiconductor substrate enables the substrate to comprise regions having p-type material and n-type material. This allows for CMOS components to form within both n-type material and within p-type material on the same substrate, thereby enabling monolithic integration of the MEMs pressure sensor with a bulk isolated CMOS integrated chip.

The semiconductor substrate is selectively masked by forming a first masking layer that defines one or more deep well regions. In an embodiment, the first masking layer comprises a patterned photoresist layer. The patterned photoresist layer may be formed on the surface of the substrate by way of a spin coating photoresist onto the substrate. The spin coated photoresist is then patterned by selective exposure to a light source (e.g., UV light) and subsequently developed.

At step 506, a deep well implant is performed. The deep well implant may comprise the implantation of a p-type dopant (e.g., boron, gallium, etc.) or an n-type dopant (e.g., phosphorus, arsenic, etc.) into the semiconductor substrate. The dopants are implanted at a dopant concentration that is sufficiently high to form a PN junction that acts as a reverse-bias diode, which acts to control an etching depth (e.g., at step 524). In an embodiment, an n-type dopant is implanted into a p-type substrate at a dose of approximately $10^{12}$ cm$^{-3}$ to approximately $10^{17}$ cm$^{-3}$. In another embodiment, phosphorus ions are implanted into the p-type substrate at a dose of approximately $10^{14}$ cm$^{-3}$ to approximately $5 \times 10^{17}$ cm$^{-3}$. In an embodiment, the deep well implant may be selectively performed within areas of the substrate that were not masked at step 504. In another embodiment, the deep well implant may comprise a blanket implant performed over the entire semiconductor substrate (e.g., over an unmasked substrate).

At step 508, the deep well implant is driven into the substrate. Driving the deep well implant into the substrate comprises diffusing the dopants introduced at step 506 to a desired depth within the substrate. In an embodiment, the deep well implant is driven into the substrate by exposing the substrate to an elevated temperature. The deep well implant can be driven into the substrate to a various depths depending on the temperature and time of the drive in. In some embodiments, the implanted ions are driven into the substrate to a depth of between approximately 7 microns and approximately 11 microns by exposing the substrate to a temperature of about 1100-1200° C. for about 300-400 minutes. Such a depth provides for a sufficient elasticity to the MEMs pressure sensor diaphragm. Once the deep well implant is driven into the substrate the masking oxide formed at step 504 is removed.

By changing the temperature and length of the drive in, varying deep well depths may be achieved. In an embodiment, predictive simulations executed on a computer may be performed prior to implantation at step 506 and drive in at step 508. The predictive simulations can be used to determine a PN junction depth and doping profile. Such simulations enable a precise PN junction depth and doping profile to optimize performance of the MEMs pressure sensor.

Once the deep well has been formed within the substrate, a MEMs pressure sensor device may be formed within the substrate, at step 510. The MEMs pressure sensor will have a diaphragm with a thickness that is defined by the depth of the deep well implant. Steps 512 -524 illustrate an exemplary method for forming a MEMs pressure sensor within a substrate having a deep well formed therein. In some embodiments, alternative steps for forming a MEMs pressure sensor may be used, such that illustrated steps 512-524 are not performed and are therefore illustratively shown in dashed boxes.

At step 512, the substrate is masked and a sensor implant is performed. In an embodiment, the substrate is masked by a second masking layer including a patterned photoresist layer.

Once the substrate is masked, a sensor implantation is performed. The sensor implantation comprises a doping type that is the same as that of the substrate (e.g., p-type dopant within an n-type environment), and which has a higher concentration of about $10^{18}$, for example. The sensor implants form a resistive shallow well within the deep well that operates as a piezoresistive element. The implants are formed into the deep well at openings in the masking layer.

At step 514, the substrate is again masked and a shallow implantation is performed. In an embodiment, the substrate is masked by a third masking layer including a patterned photoresist layer, for example. Once the substrate is masked a high concentration implantation is performed to implant dopants into the deep well at openings in the third masking layer. In some embodiments, the implantation comprises a doping type that is the same as that of the sensor implant, but which has a higher concentration greater than about $10^{18}$, for example. The implantation forms well contacts, which improve the connection between the resistive shallow wells and metallization layers, thereby allowing signals from sensor resistive shallow wells to be picked up.

At step 516, one or more protective layers are formed on the backside of the substrate. The protective layer may comprise a $SiO_2$ layer formed by physical vapor deposition, in an embodiment.

At step 518, one or more metallization layers are formed. The metallization layers are configured to connect the piezoresistor to an analog to digital converting element(s).

At step 520, a passivation layer is formed above the metallization layer. In an embodiment, the passivation layer comprises an oxide/glass and/or silicon nitride layer formed over the surface of the substrate using a physical vapor deposition, for example.

At step 522, the protective layer is selectively removed from the backside of the substrate to form an opening. In an embodiment, the protective layer is removed using a photolithography and etch process, in which a photoresist material is formed on selective parts of the protective layer and the layer is etched in the open parts of the photoresist material.

At step 524, the substrate is subjected to an electrochemically controlled etching (ECE) process.

Some embodiments of an exemplary semiconductor substrate, whereon such a methodology 500 is implemented, are illustrated in cross-sectional views of FIGS. 6-15. It will be appreciated that although FIGS. 6-15 are described in relation to the formation of MEMs pressure sensor comprising having certain doping types, these doping types are not limiting and may vary in alternative embodiments.

Figure 6:
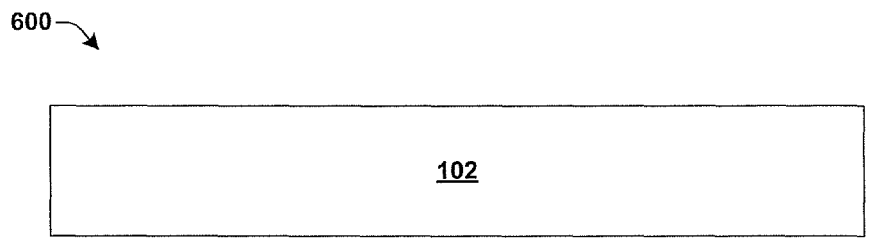
FIGS. 6-15 are cross-sectional views of some embodiments of an example semiconductor substrate upon which a method of forming a MEMs pressure sensor is performed.

FIG. 6 illustrates a cross sectional view of an embodiment of a semiconductor substrate corresponding to the substrate of step 502. For illustration, the substrate 102 in FIG. 6 comprises a non-epitaxial, p-type silicon substrate.

Figure 7:
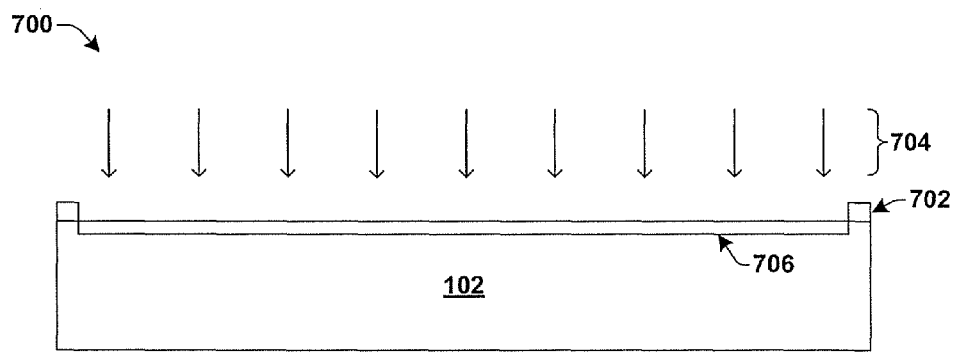

FIG. 7 illustrates a cross sectional view 700 of an embodiment of an implantation 704 provided to the semiconductor substrate 102, which corresponds to the implantation of step 506. The implantation 704 provides a desired n-type implant dose into one or more regions of the p-type substrate 102 that are not covered by a first masking layer 702. The implantation 704 results in the desired n-type implant dose being provided within a relatively shallow implant region 706 having a high n-type dopant concentration to a first depth within the substrate 102.

Figure 8:
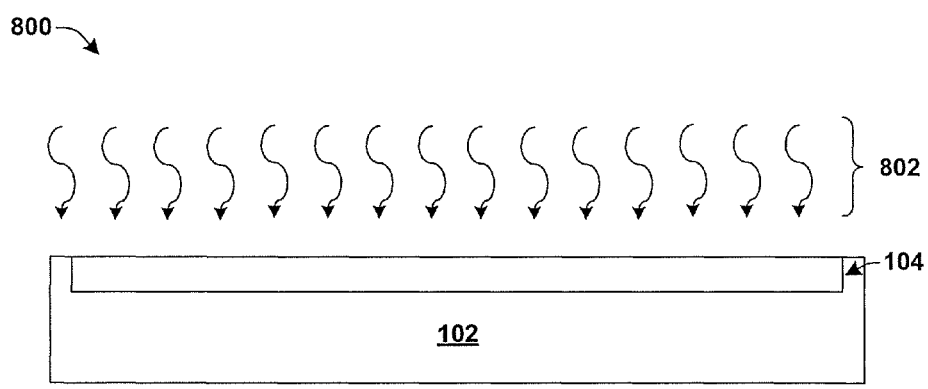

FIG. 8 illustrates a cross sectional view 800 of an embodiment of a drive in of the implanted n-type dopants corresponding to the drive in of step 508. The drive in comprises exposing the wafer to a high temperature 802, so as to thermally excite the n-type dopants in the shallow implant region 706 in FIG. 7 and cause them to diffuse to a greater depth within the p-type substrate 102. The drive in results in a deep well 104 having a high dopant concentration that extends within the substrate to a second depth greater than the first depth.

Figure 9:
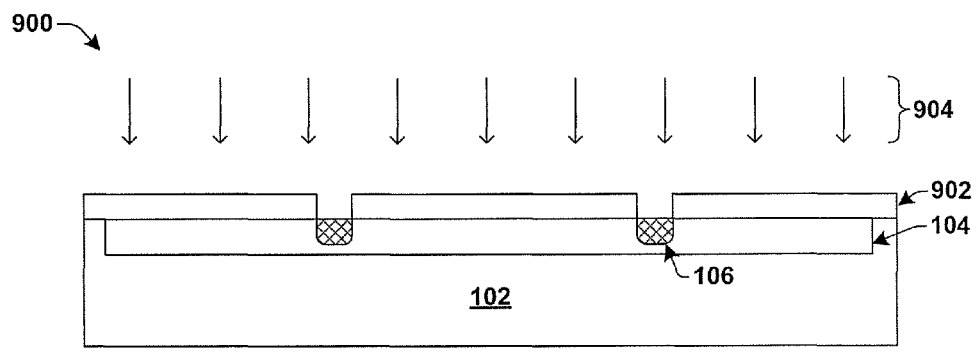

FIG. 9 illustrates a cross sectional view 900 of an embodiment of a sensor implant corresponding to the sensor implant of step 512. As illustrated in FIG. 9, a second masking layer 902 is formed above the substrate to selectively mask the deep n-well 104. The senor implants 904 are introduced into the deep well at a high concentration of a p-type dopant to form one or more shallow wells 106.

Figure 10:
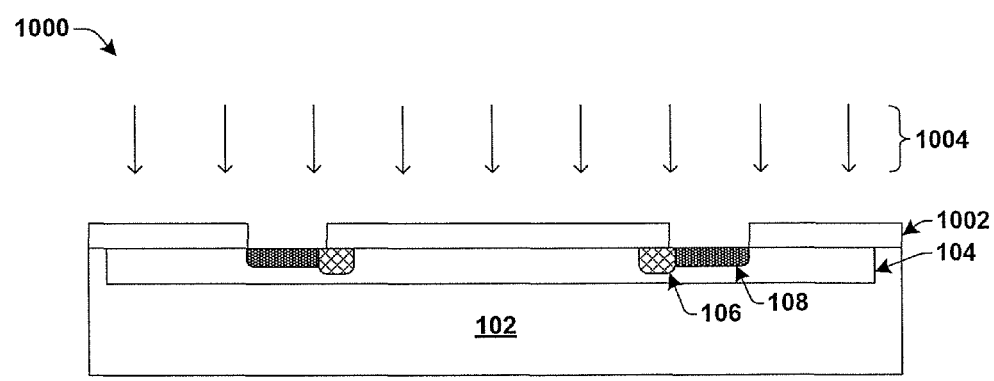

FIG. 10 illustrates a cross sectional view 1000 of an embodiment of a well contact implant corresponding to well contact implant of step 514. As illustrated in FIG. 10, a third masking layer 1002 is formed above the substrate to selectively mask the deep well 104. The substrate contact implantation 1004 implants a high concentration of a p-type dopant into the deep well to form one or more substrate contacts 1006. The shallow wells 106 and the well contacts 108 may overlap each other in some embodiments.

Figure 11:
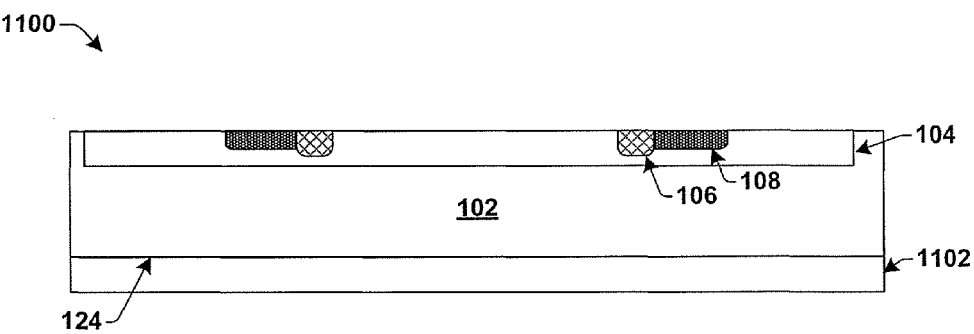

FIG. 11 illustrates a cross sectional view 1100 of an embodiment of the formation of one or more protective layers 1102 on a backside 124 of the semiconductor substrate 102 corresponding to step 516.

Figure 12:
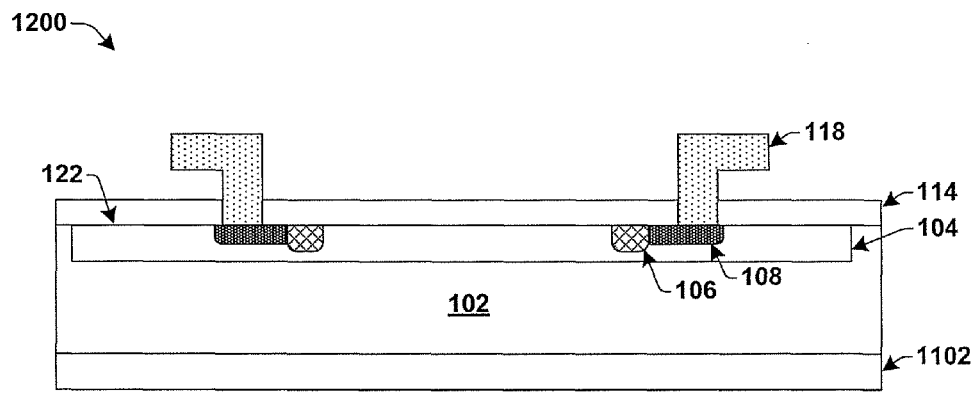

FIG. 12 illustrates a cross sectional view 1200 of an embodiment of a metallization layer formation corresponding to step 518. As illustrated in FIG. 12, the metallization layers 118 are formed to be partially within an interlevel dielectric (ILD) layer 114 located on the top surface 122 of the substrate 102. In an embodiment, the metallization layers 118 comprise a Ti or TiN plug in contact with the one or more shallow p-wells 108 within the deep n-well 104. The metallization layers 118 may further comprise copper and/or aluminum wires extending perpendicular the plug to provide lateral connections to the piezoresistor.

Figure 13:
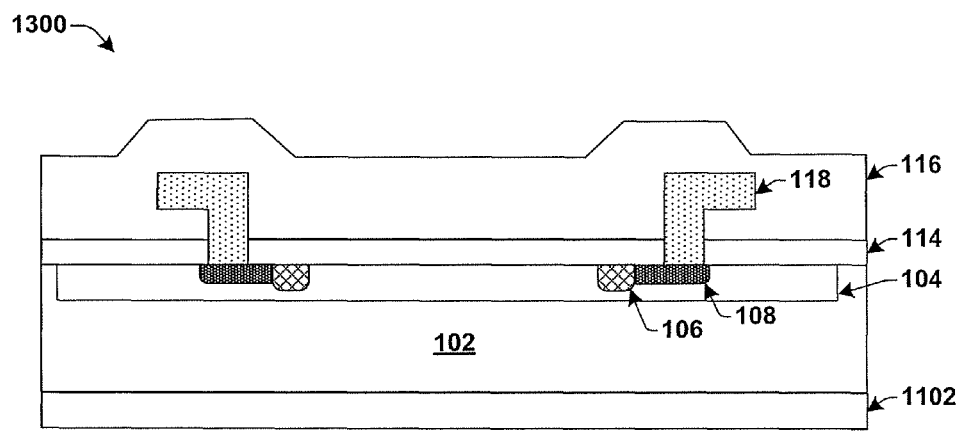

FIG. 13 illustrates a cross sectional view 1300 of an embodiment of a passivation layer being formed, which corresponds to step 522. As illustrated in FIG. 13, the passivation layer 116 encloses the semiconductor substrate 102.

Figure 14:
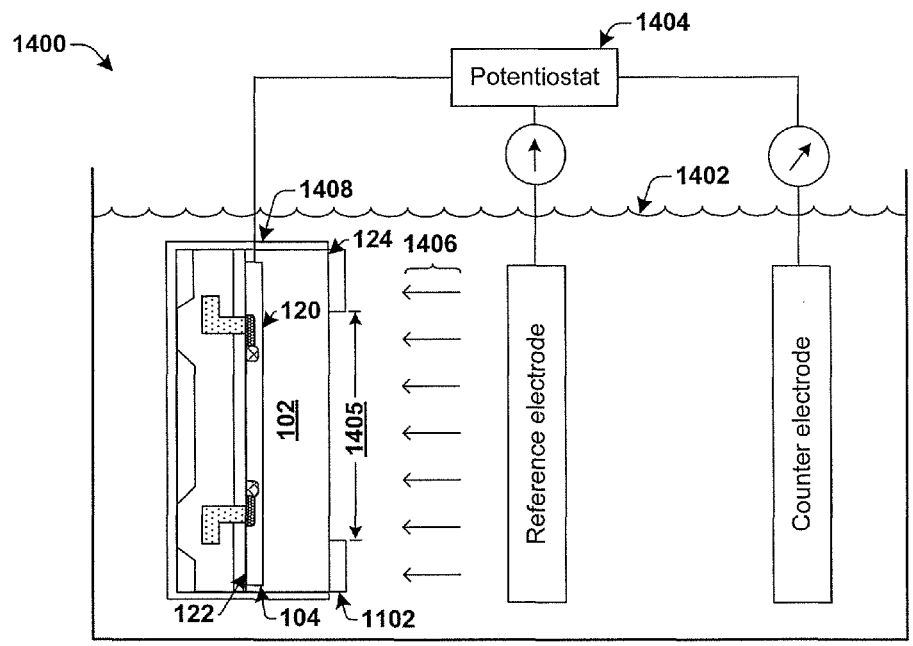

FIG. 14 illustrates a cross sectional view 1400 of an embodiment of an ECE etchant bath corresponding to step 524. As illustrated in FIG. 14 the substrate 102 is immersed in a bath 1402 of etchant (e.g., a KOH bath). An opening 1405 in the protective layers 1102 defines an area in which a cavity is to be formed in the substrate 102. A wafer holder 1408, connected to a potentiostat 1404, is configured to protect the top surface 122 of the substrate 102 from the etchant 1406 and to provide an electrical contact to the deep n-well 104. A counter electrode 1412 and a reference electrode 1410, located within the etchant bath 1402, are also connected to the potentiostat 1404. The reference electrode 1410 is configured to adjust the voltage between the wafer holder 1408 and the counter electrode 1412.

During etching, the potentiostat 1404 is configured to apply a controlled bias between the deep n-well 104 and the bath 1402 of etchant, causing the etchant 1406 to etch the backside 124 of the semiconductor substrate 102. A PN junction 120, located at the intersection of the deep n-well 104 and the p-type substrate 102, acts as a reverse-biased diode preventing the etchant 1406 from being exposed to any current, so that the etchant 1406 performs a normal anisotropic etch through the substrate 102 until it reaches the PN junction 120. Then, because the reverse-biased diode has been etched away, the etchant 1406 (e.g., KOH) is exposed to the applied bias, and a reaction forms a thin layer of silicon dioxide that stops the etch.

Figure 15:
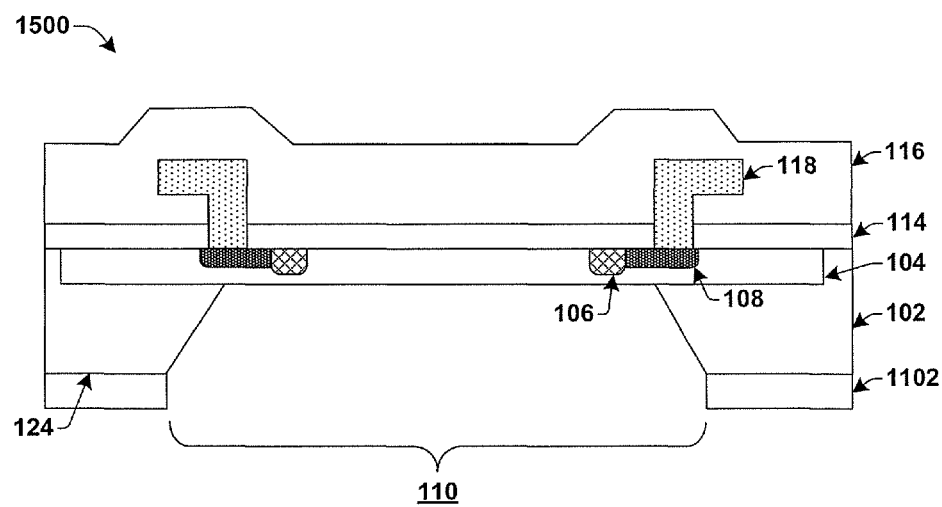

FIG. 15 illustrates a cross sectional view 1500 of an embodiment of a MEMs pressure sensor formed by method 500. As illustrated in FIG. 15, the resulting semiconductor substrate 102 comprises a cavity 110 within the backside 124 of the substrate that is abuts the deep n-well 104. In an embodiment in which the silicon wafer comprises a <100> crystal orientation, the cavity 110 comprises steep sidewall angles (e.g., 54.7° angle with the backside surface) since potassium hydroxide (KOH) displays an etch rate selectivity that is higher in a <100> crystal direction than in a <111> crystal direction. It will be appreciated that the size of the cavity 110 may be adjusted by varying the depth of the deep n-well (and therefore the depth of the PN junction within the substrate) formed at steps 504-508.

It will be appreciated that while reference is made throughout this document to exemplary structures in discussing aspects of methodologies described herein, those methodologies are not to be limited by the corresponding structures presented. For example, the methodologies set forth in FIG. 15 are not limited to the structure presented in FIGS. 6-15. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

What is claimed is:

1. A method of micro-electro mechanical system (MEMs) processing, comprising:
   forming a deep well within a first side of a semiconductor substrate having a first doping type, wherein the deep well has a second doping type;
   forming one or more shallow wells having the first doping type within the deep well, wherein the one or more shallow wells operate as resistive elements within the deep well; and
   selectively etching a second side of the semiconductor substrate by performing an electrochemically controlled etching (ECE) process to form a cavity abutting the deep well, resulting in a diaphragm structure that operates as a piezoresistor that is configured to measure pressure within the cavity.

2. The method of claim 1, wherein the deep well comprises a gradient doping profile extending perpendicular from a top surface of the semiconductor substrate through the deep well.

3. The method of claim 1, wherein complementary metal-oxide-semiconductor (CMOS) components are formed within a first region of the semiconductor substrate having an n-type material and within an adjacent second region of the semiconductor substrate having a p-type material.

4. The method of claim 1, wherein the first doping type comprises a p-doping to result in a p-type semiconductor substrate and wherein the second doping type comprises an n-type doping to result in a deep n-well.

5. The method of claim 2, wherein the gradient doping profile comprises a dopant concentration that is inversely proportional to the distance from the top surface of the semiconductor substrate.

6. The method of claim 4, wherein the ECE process stops at a PN junction formed between the semiconductor substrate and the deep n-well.

7. The method of claim 4, wherein forming the deep well comprises:
   implanting an n-type dopant into the p-type semiconductor substrate; and
   exposing the semiconductor substrate to an elevated temperature to drive the n-type dopant to a greater depth within the semiconductor substrate, thereby forming the deep n-well.

8. The method of claim 6, wherein the PN junction has a depth that is determined prior to forming the deep well through predictive simulations of a gradient doping profile within the deep well.

9. The method of claim 7, wherein the n-type dopant is implanted into the semiconductor substrate at a dose ion a range of approximately $10^{12}$ cm$^{-3}$ to approximately $10^{17}$ cm$^{-3}$.

10. The method of claim 7, wherein the n-type dopant is driven into the semiconductor substrate by exposing the substrate to a temperature in a range of approximately 1100° C. to approximately 1200° C. for approximately 300 minutes to approximately 400 minutes.

11. A micro-electro mechanical system (MEMs) pressure sensor, comprising:
    a semiconductor substrate having a first doping type;
    a deep well located within a first side of the substrate to a depth, wherein the deep well has a second doping type having a gradient doping profile; and
    a cavity disposed within a second side of the substrate at a position opposing the deep well, such that the deep well abuts the cavity;
    wherein the cavity forms a pliable diaphragm within the substrate having a thickness that is defined by the depth of the deep well.

12. The MEMs pressure sensor of claim 11, the gradient doping profile is inversely proportional to the distance from the top surface of the substrate.

13. The MEMs pressure sensor of claim 11, further comprising:
    one or more shallow wells located within the deep well and configured to operate as diffusion resistors, wherein the one or more shallow wells enable the deep well to operate as a piezoresistor that is configured to change its resistance as a function of pressure within the cavity.

14. The MEMs pressure sensor of claim 11, wherein the MEMs pressure sensor comprises a monolithic MEMs pressure sensor having CMOS components within a first region of n-type material and within an adjacent second region of p-type material.

15. The MEMs pressure sensor of claim 11, wherein the first doping type comprises a p-doping to result in a p-type semiconductor substrate and wherein the second doping type comprises an n-type doping to result in a deep n-well.

16. A MEMs pressure sensor, comprising:
a p-type non-epitaxial silicon substrate;
a diaphragm located within a first side of the p-type non-epitaxial silicon substrate;
an n-type deep well having a gradient doping profile and located within the diaphragm;
one or more p-type shallow wells located within the n-type deep well that operates as piezoelectric resistors; and
a cavity located within a second side of the p-type non-epitaxial silicon substrate and abutting the diaphragm;
wherein a pressure within the cavity is configured to generate a force that acts upon the diaphragm to change the piezoelectric resistors' resistance as a function of pressure difference applied on the diaphragm.

17. The MEMs pressure sensor of claim 16, wherein the one or more p-type shallow wells have a doping concentration higher than that of the n-type deep well.

18. The MEMs pressure sensor of claim 16, wherein the gradient doping profile comprises a dopant concentration that is inversely proportional to the distance from the top surface of the p-type non-epitaxial silicon substrate.

19. The MEMs pressure sensor of claim 16, wherein the MEMs pressure sensor comprises a monolithic MEMs pressure sensor having CMOS components within a first region of n-type material and within an adjacent second region of p-type material.

20. The MEMs pressure sensor of claim 16, wherein the cavity is formed to have steep sidewall angle that stops at a PN junction formed between the p-type non-epitaxial silicon substrate and the n-type deep well.

* * * * *